United States Patent [19]

Suzuki

[11] 4,114,049
[45] Sep. 12, 1978

[54] COUNTER PROVIDED WITH COMPLEMENTARY FIELD EFFECT TRANSISTOR INVERTERS

[75] Inventor: Yasoji Suzuki, Kawasaki, Japan

[73] Assignee: Tokyo Shibaura Electric Co., Ltd., Kawasaki, Japan

[21] Appl. No.: 735,133

[22] Filed: Oct. 26, 1976

Related U.S. Application Data

[63] Continuation of Ser. No. 333,145, Feb. 16, 1973, abandoned.

[30] Foreign Application Priority Data

Feb. 25, 1972 [JP] Japan .................................. 47-18864

[51] Int. Cl.² .................... H03K 23/08; H03K 27/00; H03K 19/08; H03K 19/20
[52] U.S. Cl. ............................. 307/225 C; 307/200 B; 307/205; 307/214; 307/224 C; 307/279
[58] Field of Search ........... 307/220 R, 220 C, 221 R, 307/221 C, 223 R, 223 C, 224 R, 224 C, 225 R, 225 C, 214, 269, 205, 279, 200 B; 58/23 A, 50 R

[56] References Cited

U.S. PATENT DOCUMENTS

| | | | |
|---|---|---|---|
| 3,560,998 | 2/1971 | Walton | 58/23 A |
| 3,657,557 | 4/1972 | Smith et al. | 307/225 C |
| 3,716,723 | 2/1973 | Heuner et al. | 307/221 C |
| 3,737,673 | 6/1973 | Suzuki | 307/205 |
| 3,745,371 | 7/1973 | Suzuki | 307/221 C |
| 3,766,408 | 10/1973 | Suzuki | 307/223 C |
| 3,823,551 | 7/1974 | Riehl | 58/50 R X |
| 3,829,712 | 8/1974 | Hama | 307/225 C |

FOREIGN PATENT DOCUMENTS

2,120,627  11/1971  Fed. Rep. of Germany .......... 307/205

*Primary Examiner*—Larry N. Anagnos
*Attorney, Agent, or Firm*—Flynn & Frishauf

[57] ABSTRACT

A binary counter provided with complementary field effect transistor inverters which includes at least three complementary field effect transistor inverters, at least two of which comprise clocked inverters acting upon receipt of clock signals having a complementary relationship. The three inverters are cascade connected with the output terminal of the last stage inverter connected to the input terminal of the first stage inverter, and the two clocked inverters are made to act alternately upon receipt of complementary clock signals, thereby enabling an output to be generated from the output side of one of the inverters with a frequency equal to half that of clock signals simultaneously supplied to both clocked inverters.

30 Claims, 18 Drawing Figures

COUNTER PROVIDED WITH COMPLEMENTARY FIELD EFFECT TRANSISTOR INVERTERS

This is a continuation, of application Ser. No. 333,145, filed Feb. 16, 1973, now abandoned.

This invention relates to a counter comprised of insulated gate field effect transistors, and more particularly to a counter provided with complementary insulated gate field effect transistors and which is easily fabricated using integrated circuit techniques.

Recently, large scale integrated circuits in which several thousands of active elements are formed in a minute semiconductor chip or wafer have been developed and applied in various fields of industry. If, in this case, the circuits formed within a single semiconductor chip occupy a large space, then the chip will have to be increased in size, decreasing the yield and elevating the production cost of such integrated circuits.

Large scale integrated circuits are widely accepted particularly in the field of electronic computers. As a result, counters often used in an electronic computer are also integrated on a large scale. Elements used in a counter preferably include insulated gate field effect transistors (hereinafter referred to as "IGFET's") which are easy of integration. Counters applied in various fields include a binary counter. The conventional binary counter includes of a well known flip-flop circuit, which is, however, not particularly well suited for integration due to a large number of elements involved. A known binary counter having a small number of elements is one comprised of complementary field effect transistor inverters. Such counter or shift register includes, for example, three cascade connected inverters, and further field effect transistors acting as a first and a second transmission gate which are respectively so designed as to connect the output terminal of the first inverter to the input terminal of the second inverter and the output terminal of the third inverter to the input terminal of the first inverter by means of a conduction path formed across the source and drain of said transistors. Each of the aforesaid three cascade connected complementary field effect transistor inverters has two field effect transistors of opposite types of conductivity whose conduction paths are connected in series across a power source. The gate electrodes of the two field effect transistors are used as input terminals and the drain electrodes thereof as output terminal. The aforesaid field effect transistors respectively acting as a first and a second transmission gate are alternately enabled by clock signals supplied thereto.

The above-mentioned type of binary counter or shift register includes a small number of elements and is easily formed by integrated circuit techniques. However, the counter raises the problem that the electrodes used as the input and output terminals of the field effect transistors constituting the inverters are not of the same type as those used as the input and output terminals of the field effect transistors acting as transmission gates. Namely, the gate electrodes of the field effect transistors constituting the inverters are used as input terminals and the drain electrodes of said transistors as output terminals, while the source electrodes of the field effect transistors acting as transmission gates are used as input terminals and the drain electrodes of said transistors as output terminals. Where, therefore, the binary counter or shift register is made into a multistage type, the required pattern design will present considerable difficulties and consume a great deal of time.

It is accordingly the object of this invention to provide a counter comprising only inverter circuits and consequently, when made into a multistage type, is easy of pattern design.

SUMMARY OF THE INVENTION

A binary dynamic counter according to the present invention includes three complementary field effect transistor inverters, at least two of which comprise clocked inverters acting upon receipt of clock signals. The remaining basic inverter is a complementary field effect transistor inverter and has two field effect transistors of opposite conductivity type, or P and N channels whose conduction paths formed between source and drain are connected in series across a power source. The gate electrodes of said P- and N- channel transistors are used as the common input terminal of the inverter and the drain electrodes thereof as the common output terminal of the inverter. Where the input terminal of the basic inverter is supplied with a signal having a voltage level corresponding to either binary "1" or "0", then one of said two field effect transistors is rendered conducting to generate an output signal having a voltage level corresponding to the binary "0" or "1".

Each clocked inverter has a pair of field effect transistors or switching elements which connect the conduction paths of the two field effect transistors constituting a basic inverter to the corresponding power supply terminals, one of said paired field effect transistors being of the same conductivity type as one of the two field effect transistors of the basic inverter and the other of said paired field effect transistors being of the same conductivity type as the other of said basic inverter transistors. The gate electrodes of the paired switching transistors are supplied with clock signals having a complementary relationship to render the conduction paths of said switching transistors to be rendered conducting or nonconducting at the same time. Where the switching transistors are rendered conducting, the clocked inverter acts in the same manner as the basic inverter. Said switching transistors are supplied with clock signals so as to cause the two clocked inverters alternately to act as an inverter. As the result, an output is produced from the output side of each inverter with a frequency equal to half that of a clock signal simultaneously supplied to the two clocked inverters. The clocked inverter may be modified such that the transistors used for switching have the gate electrodes supplied with an input signal and the transistors acting as inverters have the gate electrodes supplied with clock signals. Though more difficult of pattern design than the first mentioned clocked inverter, this modified clocked inverter enables data stored in the gate capacitor or input capacitor of the adjacent inverter or clocked inverter to be attenuated over a longer period.

The inverter or clocked inverter is generally operated by a D.C. voltage of fixed level. However, said voltage may be replaced by clock signals. In this case, clock signals are used for power supply, greatly facilitating pattern design.

According to another embodiment of this invention, an operation stabilizing circuit or feedback circuit is provided on the output side of each of the clocked inverters included in a dynamic binary counter to supplement the attenuation of stored data on said output side, thereby providing a static binary counter.

According to still another embodiment of the invention, a plurality of the aforesaid dynamic or static binary counters are cascade connected to constitute a multistage counter system. Where, in said multistage counter system, the clocked inverters in the second stage are supplied with output clock signals having a complementary relation with each other from the first stage, then there are generated mutually complementary signals for controlling the third stage from the second stage. Where an n number of binary counters are cascade connected, the n-order stage gives forth an output signal having a frequency equal to $1/2^n$ of that of a clock signal supplied to the first stage.

BRIEF DESCRIPTION OF THE DRAWINGS

The present invention can be more fully understood from the following detailed description when taken in connection with the accompanying drawings, in which.

DETAILED DESCRIPTION OF ILLUSTRATED EMBODIMENTS

Figures 1A, 1B, 1C, 2:
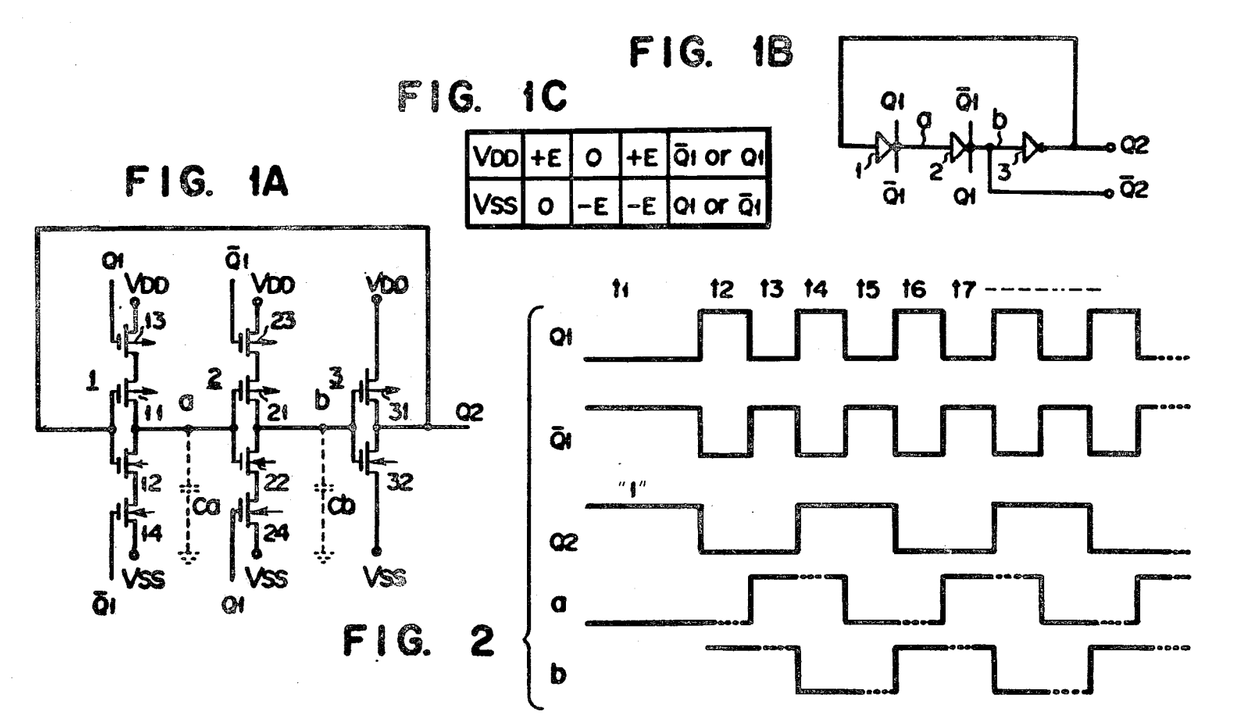
FIG. 1A is a circuit diagram of a dynamic binary counter according to an embodiment of this invention.
FIG. 1B is a logical diagram of the counter of FIG. 1A.
FIG. 1C is a table showing the voltages used in operating the counter of FIG. 1A by the positive logic.
FIG. 2 presents the wave forms of signals illustrating the operation of the counter of FIG. 1A.

FIG. 1A is a circuit diagram of a dynamic binary counter according to an embodiment of this invention, and FIG. 1B its logical diagram. As shown in FIG. 1B, a first, a second and a third inverter 1, 2 and 3 are cascade connected. The output terminal of the third inverter is connected to the input terminal of the first inverter. The first and second inverters 1 and 2 are clocked inverters alternately acting upon receipt of mutually complementary clock signals Q1 and $\overline{Q1}$. The first to third inverters 1 to 3 each have complementary field effect transistors shown in FIG. 1A. The third inverter 3 has a P channel IGFET 31 and an N channel IGFET 32. The drain electrodes of these IGFET's 31 and 32 are connected together to be used as output terminal and the gate electrodes thereof are connected together to act as input terminal. The source electrode of the IGFET 31 is connected to a point impressed with a voltage $V_{DD}$ and the source electrode of the IGFET 32 is connected to a point supplied with a voltage $V_{SS}$, thus causing conduction paths formed between the source and drain of both IGFET's to be connected in series across a power source.

The first inverter 1 includes IGFET's 11 and 12 bearing the same relation with each other as the IGFET's 31 and 32 of the third inverter 3; an IGFET 13 having the same conductivity type as the IGFET 11 and connecting the source electrode of said IGFET 11 to the $V_{DD}$ supply point through the conduction path of said IGFET 13 and an IGFET 14 having the same conductivity type as the IGFET 12 and connecting the source electrode of said IGFET 12 to the $V_{SS}$ supply point through the conduction path of said IGFET 14. The second inverter includes IGFET's 21, 22, 23 and 24 whose conduction paths are connected in series across a power source in the same relationship as the conduction path of the IGFET's 11, 12, 13 and 14 of the first inverter 1 bear with each other. The IGFET's 13, 14, 23 and 24 are used in switching. The gate electrodes of the IGFET's 13 and 14 are supplied with mutually complementary clock signals Q1 and $\overline{Q1}$ so as to render said IGFET's 13 and 14 conducting or nonconducting at the same time. Where the conduction paths of the IGFET's 13 and 14 are rendered conducting, then the associated IGFET's 11 and 12 obviously act as inverter as do the IGFET's 31 and 32 of the third inverter 3. The gate electrodes of the IGFET's 23 and 24 of the second inverter 2 are supplied with mutually complementary clock signals $\overline{Q1}$ and Q1 respectively, enabling the first and second clocked inverters 1 and 2 to be operated alternately.

Capacitances Ca and Cb indicated in broken lines in FIG. 1A respectively represent the input capacitances of the second and third inverters 2 and 3, which serve for the storage of output signals from the first and second inverters 1 and 2.

Referring again to FIG. 1A, the substrates of the respective IGFET's are denoted by arrows. The P channel IGFET's are indicated by outward directed arrows, while the N channel IGFET's are shown by inward directed arrows. The substrates of the P channel IGFET's are connected to the $V_{DD}$ supply point and those of the N channel IGFET's to the $V_{SS}$ supply point.

There will now be described by reference to FIG. 2 the operation of the binary counter of FIG. 1A, using the positive logic in which +E volts ($V_{DD}$) is denoted by the logic "1" and 0 volt ($V_{SS}$) by the logic "0".

I. Operation during the periods of $t1$ and $t2$

During the period of $t1$, there result Q1="0" and $\overline{Q1}$="1". Therefore, the IGFET's 13 and 14 of the first clocked inverter 1 are simultaneously actuated whereas the IGFET's 23 and 24 of the second clocked inverter 2 are rendered nonconducting at the same time. As the result, only the first clocked inverter 1 is operated. With an output Q2 from the third inverter 3 assumed to represent the logic "1", the IGFET 12 is actuated to cause the first clocked inverter 1 to produce an output a denoting the logic "0".

During the period of $t2$, there hold Q1="1" and $\overline{Q1}$="0". Accordingly, the IGFET's 13 and 14 of the first clocked inverter 1 are simultaneously rendered nonconducting, whereas the IGFET's 23 and 24 of the second clocked inverter 2 are jointly actuated. As the result, only the second clocked inverter 2 is operated. During this period, an output $a$ from the first clocked inverter 1 (not denoting the logic "0") is stored by the capacitor Ca as indicated in a broken line (FIG. 1A). Since an input signal to the second clocked inverter 2 represents the logic "0", the IGFET 21 is rendered conducting to produce an output $b$ denoting the logic "1". Said output $b$ of "1" actuates the IGFET 32 of the third inverter 3, which in turn gives forth an output Q2 of "0". Said output Q2 does not affect the first clocked inverter 1 which does not produce any output at this point.

II. Operation during the periods of $t3$ and $t4$

During the period of $t3$, there result Q1="0" and $\overline{Q1}$="1". Therefore, the first clocked inverter 1 is operated, but the second clocked inverter 2 is not actuated. During this time, an output $b$ ("1") from the second inverter 2 is stored by the input capacitance Cb of the third inverter 3 indicated in a broken line in FIG. 1A. An output Q2 ("0") from the third inverter actuates the IGFET 11 of the first clocked inverter to produce an output $a$ ("1").

During the period of $t4$, the first clocked inverter 1 is rendered nonconducting to have its output $a$ ("1") stored by the capacitance Ca. The second inverter 2 which is now operated gives forth an output $b$ ("0").

The above-mentioned operations are repeated in succession throughout the periods of $t5$, $t6$, $t7$ . . . , and each inverter generates an output having a frequency equal to half that of the complementary clock signals Q1 and $\overline{Q1}$.

Referring to FIG. 1A, the third inverter 3 may consist of a clocked inverter capable of being actuated jointly with the second clocked inverter 2. Further, the third inverter 3 may be disposed between the first and second clocked inverters 1 and 2.

Where a voltage of the positive logic is used for operation of the respective inverters, the voltages $V_{DD}$ and $V_{SS}$ may have, as shown in FIG. 1C, such combinations of values as 0 volt $\sim -E$ volts and $+E$ volts $\sim -E$ volts in addition to the previously mentioned combination of $+E$ volts $\sim 0$ volts. Or said voltages $V_{DD}$ and $V_{SS}$ may be replaced by clock signals Q1 and $\overline{Q1}$ respectively. In this case, the voltages $V_{DD}$ and $V_{SS}$ of the first clocked inverter 1 are replaced by clock signals $\overline{Q1}$ and Q1 respectively, while the voltages $V_{DD}$ and $V_{SS}$ of the second clocked inverter 2 are substituted by clock signals Q1 and $\overline{Q1}$ respectively. The operating voltages of the third inverter 3 are replaced by clock signals in the same manner as those of the second clocked inverter 2.

Figures 3, 4A:
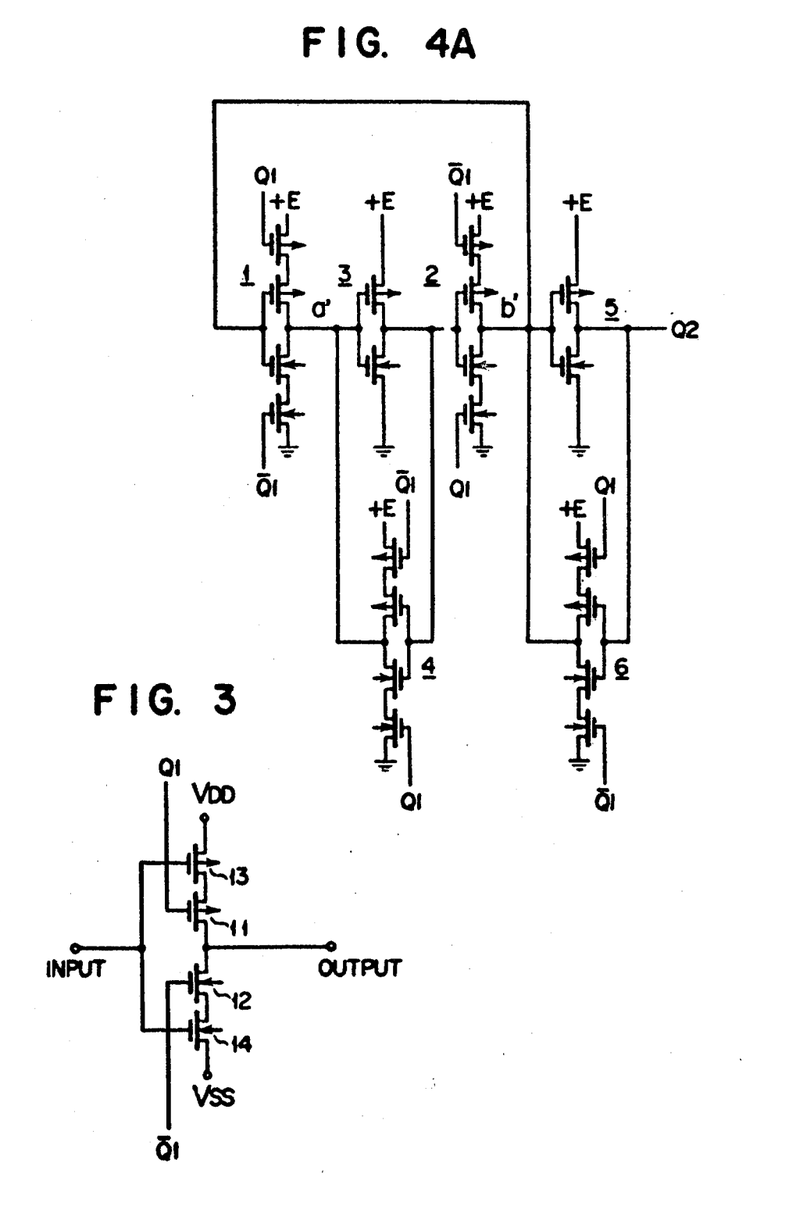
FIG. 3 is a modification of a clocked inverter used in the counter of FIG. 1A.
FIG. 4A is a circuit diagram of a static binary counter derived from the dynamic binary counter of FIG. 1A.

The arrangement of a clocked inverter, for example, a first clocked inverter 1 need not be limited to that shown in FIG. 1A, but may be varied as indicated in FIG. 3. Referring to the first clocked inverter 1 of FIG. 1A, the gate electrodes of the IGFET's 13 and 14 are supplied with input signals and the gate electrodes of the IGFET's 11 and 12 are supplied with clock signals Q1 and $\overline{Q1}$ respectively.

FIG. 4A shows a static binary counter modified from the dynamic binary counter of FIG. 1A. According to this static binary counter, a third inverter 3 is connected between a first and a second clocked inverter 1 and 2. An output from the third inverter 3 is fed back to a point $a'$ so as to compensate for the attenuation of electric energy charged at said point $a'$ by a stabilization or feedback circuit including a fourth clocked inverter 4 simultaneously operated with the second clocked inverter 2 upon receipt of clock signals Q1 and $\overline{Q1}$. Connected to the output side $b'$ of the second clocked inverter 2 are fifth inverter, and a sixth clocked inverter 6 simultaneously operated with the first clocked inverter 1 upon receipt of clock signals Q1 and $\overline{Q1}$ so as to feed back an output from the fifth inverter 5 to a point $b'$.

Figure 4B:
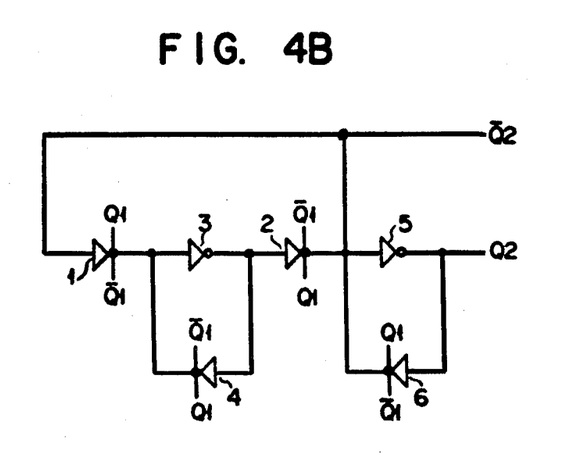
FIG. 4B is a logic diagram of the counter of FIG. 4A.

There will now be described by reference to FIGS. 4A and 4B the operation of the static binary counter. During the period in which the clock signals Q1 and $\overline{Q1}$ represent "1" and "0" respectively, namely, the first clocked inverter 1 remains nonoperative, the fourth clocked inverter 4 is rendered operative. Therefore, with the information stored at the point $a'$ assumed to denote the logic "1", then the third inverter 3 will generate an output of "0" and in consequence the fourth clocked inverter 4 will give forth an output of "1". Since said output of "1" from the fourth clocked inverter is additionally supplied to the point $a'$, the information stored there will be prevented from attenuation.

During the period in which the clock signals Q1 and $\overline{Q1}$ denote "0" and "1" respectively, namely, the second clocked inverter 2 remains inoperative, the sixth inverter 6 is rendered operative. Therefore, with the information stored at the point $b'$ assumed to denote the logic "1", then the fifth inverter 5 will produce an output of "0" and in consequence the sixth clocked inverter 6 will deliver an output of "1". Since said output of "1" from the sixth inverter 6 is additionally supplied to the point $b'$, the information stored there will be saved from attenuation.

Figure 4C:
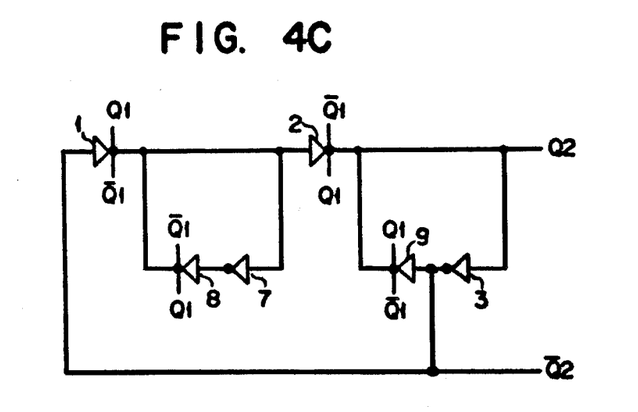
FIG. 4C is a logical diagram of a modification of a static binary counter.

The above-mentioned static binary counter may be modified as shown in FIG. 4C, from the dynamic binary counter of FIG. 1A. According to this invention, a serial circuit consisting of a fourth inverter 7 and an eighth clocked inverter 8 acting jointly with the second clocked inverter 2 is connected parallel with a connection path between the first and second clocked inverters 1 and 2. Between the third inverter 3 and the second clocked inverter 2 is connected a sixth clocked inverter 9 operated simultaneously with the first clocked inverter 1. The operation of a static binary counter thus modified will be easily inferred from the static binary counter of FIG. 4A.

Figure 5A:
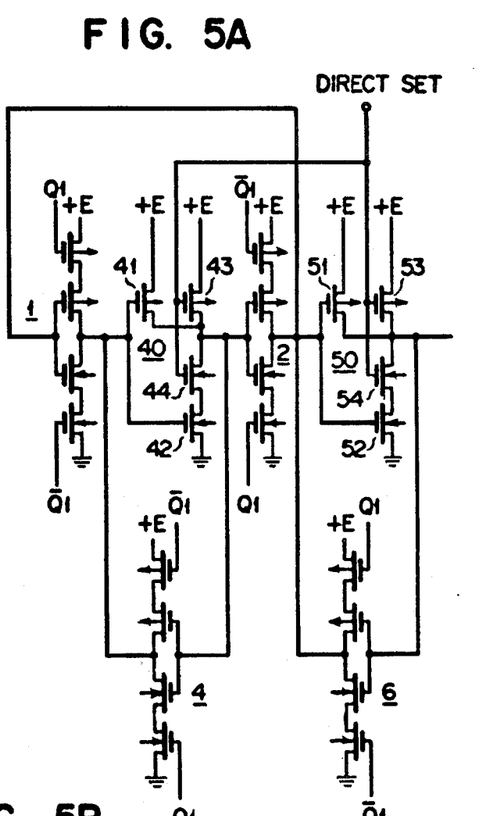
FIG. 5A shows a static binary counter with a direct set terminal modified from the static binary counter of FIG. 4A.
Figure 5B:
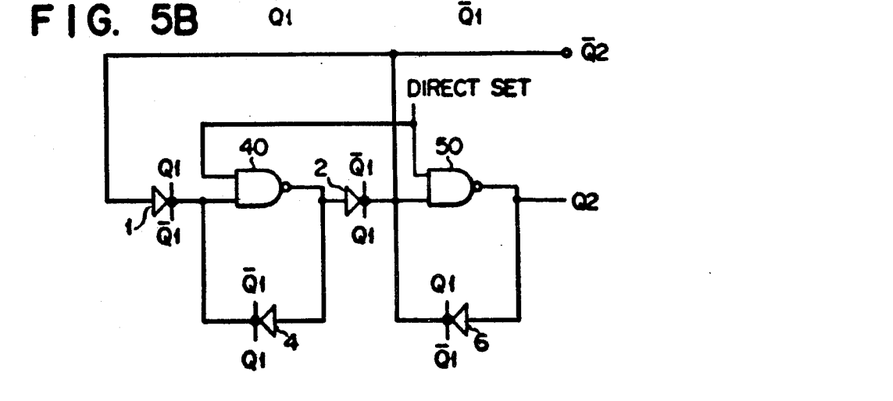
FIG. 5B is a logical diagram of the static binary counter of FIG. 5A.

FIG. 5A is a circuit diagram of a static binary counter with a direct set terminal, as modified from the static binary counter of FIG. 4A, in which the third and fifth inverters consist, as shown in FIG. 5B, of first and second NAND means 40 and 50 respectively. The first NAND means 40 includes a P channel IGFET 4 and an N channel IGFET 42 whose gate electrodes are connected to the output terminal of the first clocked inverter 1. The source of the first IGFET 41 is connected to the $V_{DD}$ supply point or a $+E$ terminal and the source of the second IGFET 42 to the $V_{SS}$ supply point or a ground terminal. The first NAND means 40 further includes a P channel IFFET 43 and an N channel IGFET 44 whose conduction paths are connected in series with the conduction path of the aforesaid second IGFET 42 across a power source. The drain electrodes of said IGFET's 43 and 44 are used as output terminal and also connected to the drain electrode of the aforesaid first IGFET 41. The gate electrodes of the IGFET's 43 and 44 are connected to the direct set terminal.

The second NAND means 50 includes IGFET's 51, 52, 53 and 54 connected in the same mutual relationship as are the IGFET's 41, 42, 43 and 44 of the first NAND means 40.

Where the direct set terminal is supplied with a signal of "0", then the IGFET's 43 and 53 are rendered conducting while the IGFET's 44 and 54 are left nonconducting. As the result, the first and second NAND means 40 and 50 are forcefully set to produce an output of "1", preventing the subject apparatus as a whole from acting as a counter. Conversely where the direct set terminal is supplied with a signal of "1", then the IGFET's 43 and 53 remain nonconducting, while the IGFET's 44 and 54 are rendered conducting. Accordingly, the first and second NAND means 40 and 50 are made to act as inverters by the IGFET's 41 and 42 and the IGFET's 51 and 52 respectively, thus enabling the subject apparatus to function as a counter.

Figures 6A, 6B:
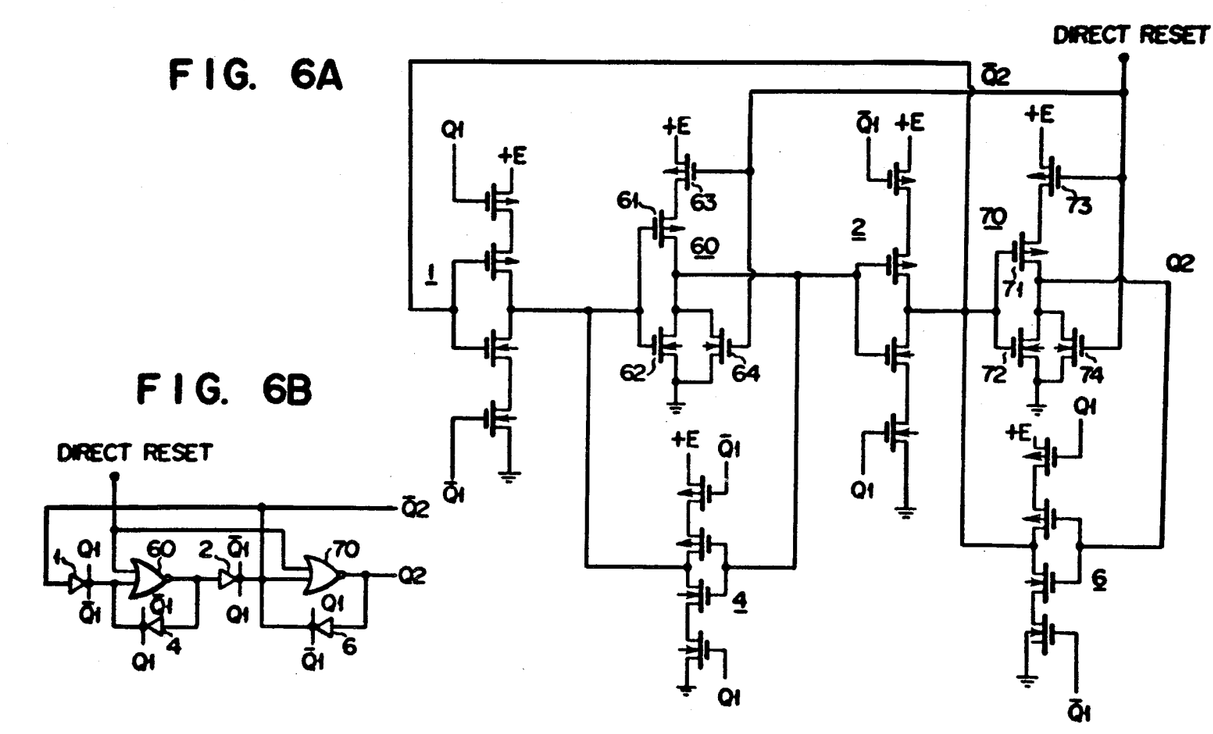
FIGS. 6A and 7A are circuit diagrams of static binary counters with a direct reset terminal.
FIGS. 6B and 7B are logical diagrams of the static binary counters of FIGS. 6A and 7A.

FIG. 6A is a circuit diagram of a static binary counter with a direct reset terminal, as modified from the static binary counter of FIG. 4A, in which the third and fifth inverters consist, as shown in FIG. 6B, of first and second NOR means 60 and 70 respectively. The first NOR means 60 includes a P channel IGFET 61 and an N channel IGIGFET 62 whose gate electrodes are connected to the output terminal of the first clocked inverter 1 and whose conduction paths are connected in series with each other. The first NOR means 60 further includes a P channel IGFET 63 which connects the source electrode of the IGFET 61 to the terminal of +E volts through the conduction path of said P channel IGFET 63 and an N channel IGFET 64 whose conduction path is connected parallel with the conduction path of the IGFET 62. The source electrode of the IGFET 62 is connected to a ground terminal, and the drain electrodes of the IGFET's 61 and 62 are jointly connected to the input terminal of the second clocked inverter 2. The gate electrodes of the IGFET's 63 and 64 are connected to the direct reset terminal.

The second NOR means 70 includes IGFET's 71, 72, 73 and 74 connected in the same mutual relationship as are the IGFET's 61, 62, 63 and 64 of the first NOR means 60.

Where the direct reset terminal is supplied with a signal of "1", then the IGFET's 63 and 73 remain nonconducting, while the IGFET's 64 and 74 are rendered conducting. Accordingly, the first and second NOR means 60 and 70 are forcefully reset to produce an output of "0", preventing the subject apparatus from acting as a counter.

Conversely where the direct reset terminal is supplied with a signal of "0", then the IGFET's 63 and 73 are rendered conductive, while the IGFET's 64 and 74 are left nonconductive. As the result, the first and second NOR means 60 and 70 act as inverters by the IGFET's 61 and 62 and the IGFET's 71 and 72 respectively, enabling the subject apparatus to function as a counter.

Figure 7A:
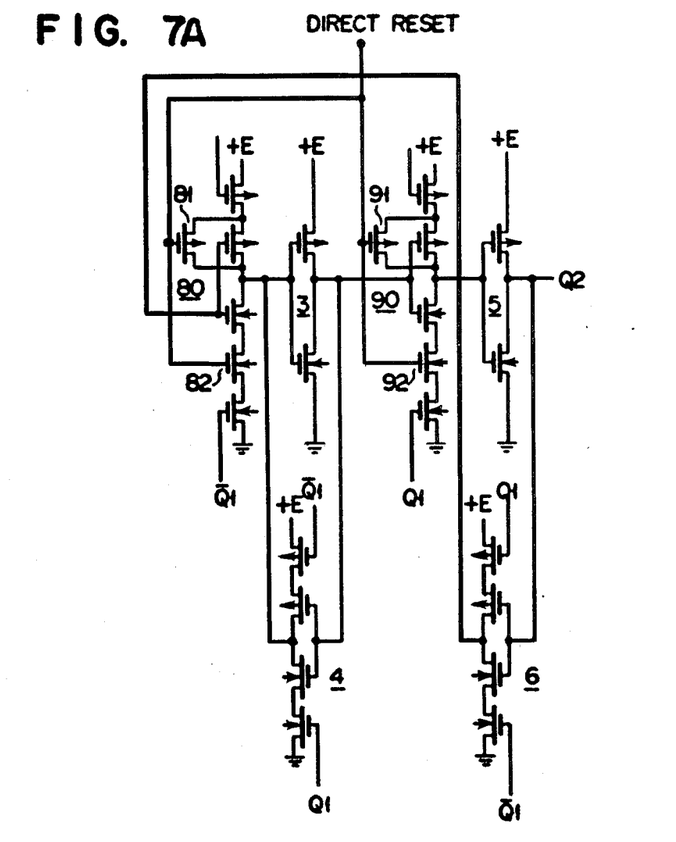
Figure 7B:
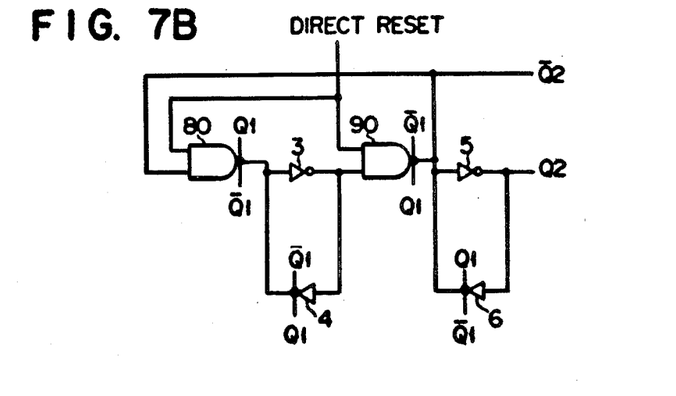

FIG. 7A is a circuit diagram of a static binary counter with a direct reset terminal, as modified from the static binary counter of FIG. 4A, in which the first and second clocked inverters 1 and 2 of FIG. 4A are replaced by a first and a second clocked NAND means 80 and 90 respectively as shown in FIG. 7B. The first clocked NAND means 80 includes, as shown in FIG. 7A, a P channel IGFET 81 and an N channel IGFET 82 in addition to the IGFET's constituting the first clocked inverter 1 of FIG. 4A. The second clocked NAND means 90 similarly includes a P channel IGFET 91 and an N channel IGFET 92. According to the static binary counter of FIG. 7A, where the direct reset terminal is supplied with a signal of "0", then the first and second clocked NAND means 80 and 90 are forcefully set to produce an output of "1" and in consequence the third and fifth inverters 3 and 5 are forcefully reset to generate an output of "0".

Figure 8A:
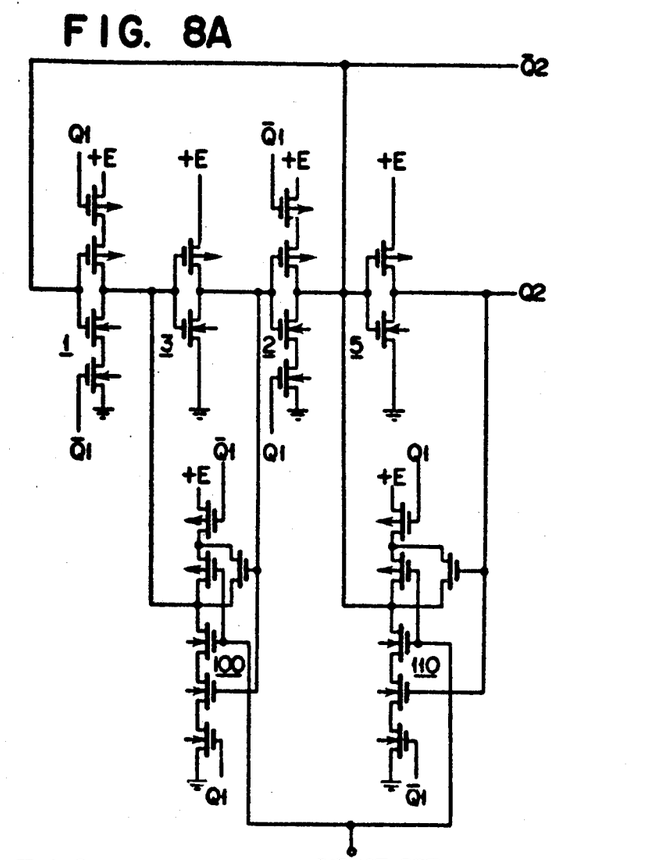
FIG. 8A is a circuit diagram of a static binary counter with a direct set terminal.
Figure 8B:
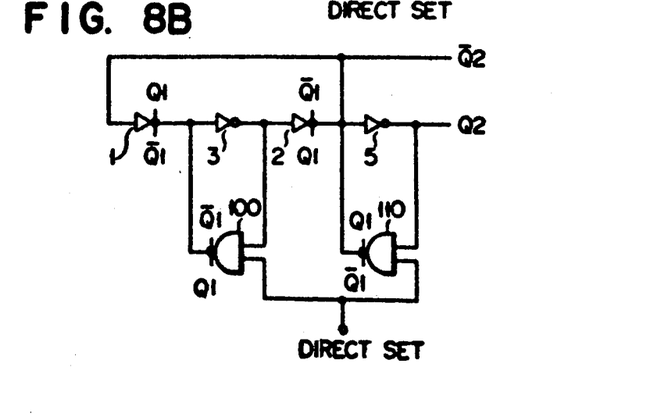
FIG. 8B is a schematic circuit diagram of the static binary counter of FIG. 8A.

FIG. 8A is a circuit diagram of a static binary counter with a direct set terminal, as modified from the static binary counter of FIG. 4A, in which a fourth and a sixth clocked inverter 4 and 6 consist, as shown in FIG. 8B, of a first and a second clocked NAND means 100 and 110. The operation of the embodiment of FIG. 8A will be easily inferred from the preceding embodiments.

Figure 9A:
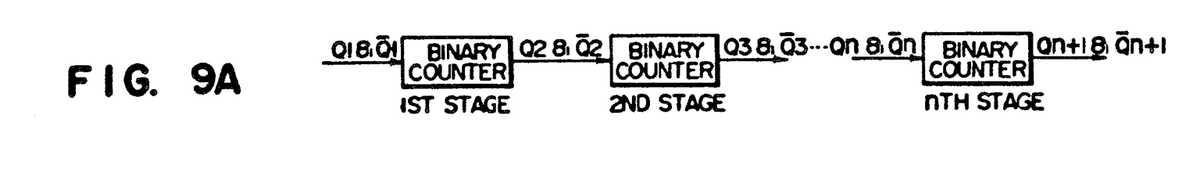
FIG. 9A indicates a multistage counter system obtained by cascade connecting a plurality of binary counters according to the invention.
Figure 9B:
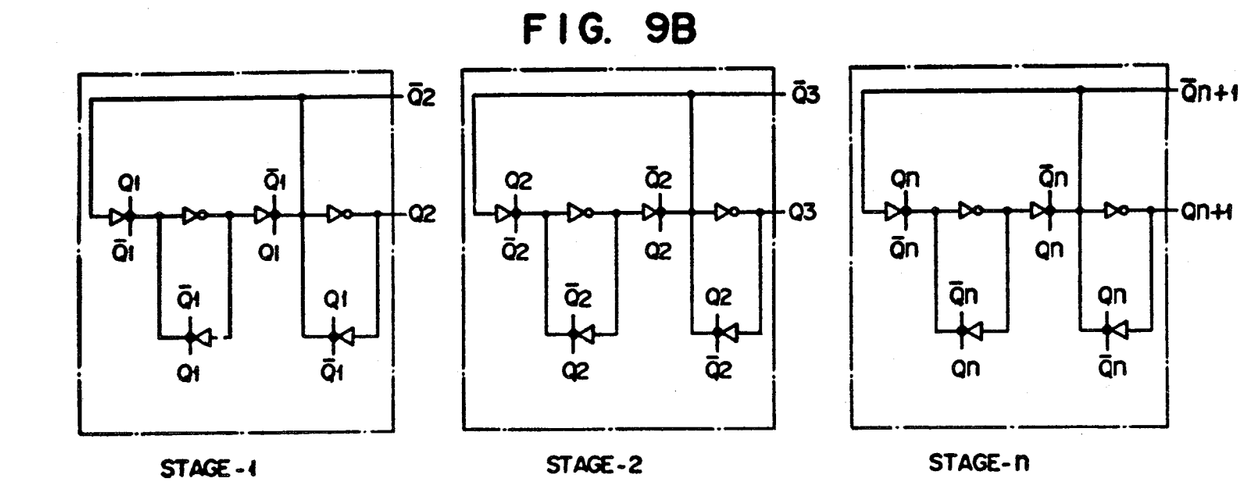
FIG. 9B shows a multistage static counter system obtained by cascade connecting a plurality of static binary counters indicated in FIG. 4A.

Cascade connection of a plurality of dynamic or static binary counters as mentioned above enables the formation of multistage dynamic or static counters. As shown in FIG. 9A, complementary output signals Q2 and $\overline{Q}2$ from the first stage binary counter are supplied to the second stage binary counter and complementary output signals Q3 and $\overline{Q}3$ from the second stage binary counter are conducted to the third stage binary counter. The above-mentioned sequence of supply of output signals is applied to the succeeding counters, thereby delivering from a binary counter occupying the n order an output $Q_{n+1}$ or $\overline{Q}_{n+1}$ having a frequency equal to $\frac{1}{2}^n$ of that of a clock signal Q1 or $\overline{Q}1$ initially supplied to the first binary counter. Referring to FIG. 9B showing a multistage arrangement of the static binary counters of FIG. 4A, the first stage binary counter produces mutually complementary outputs Q2 and $\overline{Q}2$ upon receipt of mutually complementary clock signals Q1 and $\overline{Q}1$. Said mutually complementary outputs Q2 and $\overline{Q}2$ are supplied to the clocked inverters included in the second stage binary counter, which in turn generates mutually complementary outputs Q3 and $\overline{Q}3$. Upon arrival of said outputs Q3 and $\overline{Q}3$, the third binary counter gives forth mutually complementary outputs Q4 and $\overline{Q}4$.

What is claimed is:

1. A diode-less binary counter employing insulated gate field effect transistors each having a source-drain path and a gate, said binary counter comprising:

first, second and third inverters, each inverter having an input and an output and a pair of inverting transistors of different channel types, the gates of said pair of inverting transistors of each inverter being connected to the corresponding input, the source-drain paths of said pair of inverting transistors of each inverter being connected in series between first and second power supply terminals and a circuit point between the series-connected source-drain paths of said inverting transistors being connected to the corresponding output and at least said first and third inverters being clocked inverters which operate as inverters in response to complementary input clock signals, said first and third clocked inverters each including a pair of switching transistors of different channel types, and the source-drain paths of the inverting and switching transistors of the same channel type in each said clocked inverter being connected in series between the corresponding output and the respective one of said first and second power supply terminals;

means for electrically connecting the output of said first inverter to the input of said second inverter, the output of said second inverter to the input of said third inverter and the output of said third inverter to the input of said first inverter;

means for applying complementary clock signals to the gates of switching transistors of said first and third clocked inverters so as to cause said first and third clocked inverters to operate as inverters alternately, a first clocked NAND gate circuit including a fourth inverter of the clocked type, said fourth inverter having a first and a second input and a single output, said single output of said fourth inverter being connected to the input of said second inverter and said first input of said fourth inverter being connected to the output of said second inverter, and said fourth inverter of said first clocked NAND gate circuit being simultaneously operable with said third clocked inverter in response to the complementary clock signals;

a fifth inverter having an output and an input, said input of said fifth inverter being connected to the output of said third clocked inverter; and a second NAND gate circuit including a sixth inverter of the clocked type, said sixth inverter having a first and a second input and a single output, said single output of said sixth inverter being connected to the input of said fith inverter and said first input of said sixth inverter being connected to the output of said fifth inverter, and said sixth inverter of said clocked NAND gate circuit being operable simultaneously with said first clocked inverter in response to the complementary clock signals, the second input of said fourth inverter of said first clocked NAND gate circuit and that of said sixth inverter of said clocked NAND gate circuit being connected to receive a control signal;

said inverters, connecting means, NAND gate circuits and clock pulse applying means each including no diodes, whereby an input signal and an output signal of each of said first, second and third inverters have a frequency half the frequency of said complementary input clock signals which are applied to the gates of said switching transistors of said clocked inverters.

2. A binary counter according to claim 1 wherein said pair of switching transistors of each clocked inverter are interposed between said pair of inverting transistors.

3. A binary counter according to claim 1 wherein said pair of inverting transistors of each clocked inverter are interposed between said pair of switching transistors.

4. A binary counter according to claim 3 wherein the operating voltage on said first and second power supply terminals has a fixed level.

5. A binary counter according to claim 3 wherein the level of the operating voltage on said first and second power supply terminals varies in the same relationship as that which the clock signals supplied to the gate electrodes of said switching transistors bear with each other.

6. A diode-less binary counter employing insulated gate field effect transistors each having a source-drain path and a gate, said binary counter comprising:

first, second and third inverters, each inverter having an input and an output and a pair of inverting transistors of different channel types, the gates of said pair of inverting transistors of each inverter being connected to the corresponding input, the source-drain paths of said pair of inverting transistors of each inverter being connected in series between first and second power supply terminals and a circuit point between the series-connected source-drain paths of said inverting transistors being connected to the corresponding output and at least said first and third inverters being clocked inverters which operate as inverters in response to complementary input clock signals, said first and third clocked inverters each including a pair of switching transistors of different channel types, and the source-drain paths of the inverting and switching transistors of the same channel type in each said clocked inverter being connected in series between the corresponding output and the respective one of said first and second power supply terminals;

means for electrically connecting the output of said first inverter to the input of said second inverter, the output of said second inverter to the input of said third inverter and the output of said third inverter to the input of said first inverter;

means for applying complementary clock signals to the gates of switching transistors of said first and thira clocked inverters so as to cause said first and third clocked inverters to operate as inverters alternately, said second inverter further comprising a pair of additional field effect transistors of different channel types coupled to said pair of inverting transistors of said second inverter to constitute a first NAND gate with said pair of inverting transistors of said second inverter, one of said inverting transistors and one of said additional transistors of one channel type being connected in parallel with each other, and the other of said inverting transistors and the other of said additional transistors which is of the other channel type being connected in series with each other;

a fourth clocked inverter coupling an output of said first NAND gate back to the first input thereof and operable simultaneously with said third clocked inverter in response to the complementary clock signals;

a second NAND gate having a single output and a first and a second input, said first input being connected to the output of the third clocked inverter; and a fifth clocked inverter coupling an output of said second NAND gate back to said first input of said second NAND gate and operable simultaneously with said first clocked inverter in response to the complementary clock signals;

the gate electrodes of said pair of additional transistors of said first NAND gate and said second input of said second NAND gate being connected to receive a control signal;

said inverters, connecting means, NAND gate circuits and clock pulse applying means each including no diodes;

whereby an input signal and an output signal of each of said first, second and third inverters have a frequency half the frequency of said complementary input clock signals which are applied to the gates of said switching transistors of said clocked inverters.

7. A binary counter according to claim 6 wherein said pair of switching transistors of each clocked inverter are interposed between said pair of inverting transistors.

8. A binary counter according to claim 6 wherein said pair of inverting transistors of each clocked inverter are interposed between said pair of switching transistors.

9. A binary counter according to claim 8 wherein the operating voltage on said first and second power supply terminals has a fixed level.

10. A binary counter according to claim 8 wherein the level of the operating voltage on said first and second power supply terminals varies in the same relationship as that which the clock signals supplied to the gate electrodes of said switching transistors bear with each other.

11. A diode-less binary counter employing insulated gate field effect transistors each having a source-drain path and a gate, said binary counter comprising:

first, second and third inverters, each inverter having an input and an output and a pair of inverting transistors of different channels types, the gates of said pair of inverting transistors of each inverter being connected to the corresponding input, the source-drain paths of said pair of inverting transistors of each inverter being connected in series between first and second power supply terminals and a circuit point between the series-connected source-drain paths of said inverting transistors being connected to the corresponding output and at least said first and third inverters being clocked inverters which operate as inverters in response to complementary input clock signals, said first and third clocked inverters each including a pair of switching transistors of different channel types, and the source-drain paths of the inverting and switching transistors of the same channel type in each said clocked inverter being connected in series between the corresponding output and the respective one of said first and second power supply terminals;

means for electrically connecting the output of said first inverter to the input of said second inverter, the output of said second inverter to the input of said third inverter and the output of said third inverter to the input of said first inverter;

means for applying complementary clock signals to the gates of switching transistors of said first and third clocked inverters so as to cause said first and third clocked inverters to operate as inverters alternately, said second inverter further comprising a pair of additional field effect transistors of different channel types coupled to said pair of inverting transistors of said second inverter to constitute a first NOR gate with said pair of inverting transistors of said second inverter, one of said inverting transistors and one of said additional transistors of one channel type being connected in parallel with each other, and the other of said inverting transistors and the other of said additional transistors which is of the other channel type being connected in series with each other;

a fourth clocked inverter coupling an output from said first NOR gate back to the first input of said first NOR gate and operable simultaneously with said third clocked inverter in response to the complementary clock signals;

a second NOR gate having a first and a second input and a single output and connected to the output side of said third clocked inverter, said first input being connected to the output terminal of said third clocked inverter; and a fifth clocked inverter coupling an output from said second NOR gate back to the first input of said second NOR gate and operable simultaneously with said first clocked inverter in response to the complementary clock signals;

the gate electrodes of said pair of additional transistors of said first NOR gate and the second input of said second NOR gate connected to receive a control signal;

said inverters, connecting means, NAND gate circuits and clock pulse applying means each including no diodes, whereby an input signal and an output signal of each of said first, second and third inverters have a frequency half the frequency of said comlementary input clock signals which are applied to the gates of said switching transistors of said clocked inverters.

12. A binary counter according to claim 11 wherein said pair of switching transistors of each clocked inverter are interposed between said pair of inverting transistors.

13. A binary counter according to claim 11 wherein said pair of inverting transistors of each clocked inverter are interposed between said pair of switching transistors.

14. A binary counter according to claim 13 wherein the operating voltage on said first and second power supply terminals has a fixed level.

15. A binary counter according to claim 13 wherein the level of the operating voltage on said first and second power supply terminals varies in the same relationship as that which the clock signals supplied to the gate electrodes of said switching transistors bear with each other.

16. A diode-less binary counter employing insulated gate field effect transistors each having a source-drain path and a gate, said binary counter comprising:

first, second and third inverters, each inverter having an input and an output and a pair of inverting transistors of different channel types, the gates of said pair of inverting transistors of each inverter being connected to the corresponding input, the source-drain paths of said pair of inverting transistors of each inverter being connected in series between first and second power supply terminals and a circuit point between the series-connected source-drain paths of said inverting transistors being connected to the corresponding output and at least said first and third inverters being clocked inverters which operate as inverters in response to complementary input clock signals, said first and third clocked inverters each including a pair of switching transistors of different channel types, and the source-drain paths of the inverting and switching transistors of the same channel type in each said clocked inverter being connected in series between the corresponding output and the respective one of said first and second power supply terminals;

means for electrically connecting the output of said first inverter to the input of said second inverter, the output of said second inverter to the input of said third inverter and the output of said third inverter to the input of said first inverter;

means for applying complementary clock signals to the gates of switching transistors of said first and third clocked inverters so as to cause said first and third clocked inverters to operate as inverters alternately, each of said first and third inverters including a pair of additional field effect transistors coupled to constitute first and second clocked NAND gates, in each of said first and second clocked NAND gates one of said inverting transistors and one of said additional transistors of one channel type being connected in parallel with each other and the other of said inverting transistors and the other of said additional transistors which is of the other channel type being connected in series with each other;

a fourth clocked inverter coupling an output from said second inverter back to the input of said second inverter and operable simultaneously with the clocked inverter portion in said second clocked NAND gate in response to the complementary clock signals;

a fifth inverter connected to the output side of said second clocked NAND gate; and a sixth clocked inverter coupling an output from said fifth inverter back to the input of said fifth inverter and operable simultaneously with the clocked inverter portion in said first clocked NAND gate in response to the complementary clock signals;

the gate electrodes of said additional transistors of said first clocked NAND gate and second NAND gate being connected together to receive a control signal;

said inverters, connecting means, NAND gate circuits and clock pulse applying means each including no diodes, whereby an input signal and an output signal of each of said first, second and third inverters have a frequency half the frequency of said complementary input clock signals which are applied to the gates of said switching transistors of said clocked inverters.

17. A binary counter according to claim 16 wherein said pair of switching transistors of each clocked inverter are interposed between said pair of inverting transistors.

18. A binary counter according to claim 16 wherein said pair of inverting transistors of each clocked inverter are interposed between said pair of switching transistors.

19. A binary counter according to claim 18 wherein the operating voltage on said first and second power supply terminals has a fixed level.

20. A binary counter according to claim 18 wherein the level of the operating voltage on said first and second power supply terminals varies in the same relationship as that which the clock signals supplied to the gate electrodes of said switching transistors bear with each other.

21. A diode-less binary counter employing insulated gate field effect transistors each having a source-drain path and a gate, said binary counter comprising:

first, second and third inverters, each inverter having an input and an output and a pair of inverting transistors of different channel types, the gates of said pair of inverting transistors of each inverter being connected to the corresponding input, the source-drain paths of said pair of inverting transistors of each inverter being connected in series between first and second power supply terminals and a circuit point between the series-connected source-drain paths of said inverting transistors being connected to the corresponding output and at least said first and third inverters being clocked inverters which operate as inverters in response to complementary input clock signals, said first and third clocked inverters each including a pair of switching transistors of different channel types, and the source-drain paths of the inverting and switching transistors of the same channel type in each said clocked inverter being connected in series between the corresponding output and the respective one of said first and second power supply terminals;

means for electrically connecting the output of said first inverter to the input of said second inverter, the output of said second inverter to the input of said third inverter and the output of said third inverter to the input of said first inverter;

means for applying complementary clock signals to the gates of switching transistors of said first and third clocked inverters so as to cause said first and third clocked inverters to operate as inverters alternately, a fourth clocked inverter coupling an output of said second inverter back to the input side of said second inverter and being operated simultaneously with said third clocked inverter in response to the complementary clock signals;

a fifth inverter connected to the output side of said third clocked inverter; and a sixth clocked inverter coupling an output of said fifth inverter back to the input side of said fifth inverter and being operated simultaneously with said first clocked inverter in response to the complementary clock signals;

said inverters, connecting means and clock pulse applying means each including no diodes, whereby an input signal and an output signal of each of said first, second and third inverters have a frequency half the frequency of said complementary input clock signals which are applied to the gates of said switching transistors of said clocked inverters.

22. A binary counter according to claim 21 wherein said pair of switching transistors of each clocked inverter are interposed between said pair of inverting transistors.

23. A binary counter according to claim 21 wherein said pair of inverting transistors of each clocked inverter are interposed between said pair of switching transistors.

24. A binary counter according to claim 23 wherein the operating voltage on said first and second power supply terminals has a fixed level.

25. A binary counter according to claim 23 wherein the level of the operating voltage on said first and second power supply terminals varies in the same relationship as that which the clock signals supplied to the gate electrodes of said switching transistors bear with each other.

26. A diode-less binary counter employing insulated gate field effect transistors each having a source-drain path and a gate, said binary counter comprising:

first, second and third inverters, each inverter having an input and an output and a pair of inverting transistors of different channel types, the gates of said pair of inverting transistors of each inverter being connected to the corresponding input, the source-drain paths of said pair of inverting transistors of each inverter being connected in series between first and second power supply terminals and a circuit point between the series-connected source-drain paths of said inverting transistors being connected to the corresponding output and at least said first and second inverters being clocked inverters which operate as inverters in response to complementary input clock signals, said first and second clocked inverters each including a pair of switching transistors of different channel types, and the source-drain paths of the inverting and switching transistors of the same channel type in each said clocked inverter being connected in series between the corresponding output and the respective one of said first and second power supply terminals;

means for electrically connecting the output of said first inverter to the output of said second inverter, the output of said second inverter to the output of said third inverter and the output of said third inverter to the input of said first inverter;

means for applying complementary clock signals to the gates of switching transistors of said first and second clocked inverters so as to cause said first and second clocked inverters to operate as inverters alternately, a fourth inverter the input of which is connected in parallel with the output of said first clocked inverter;

a fifth clocked inverter the input and output of which are connected to the output of said fourth inverter and said first clocked inverter, respectively, and operated simultaneously with said second clocked inverter in response to the complementary clock signals; and a sixth clocked inverter connected between outputs of said third inverter and said second clocked inverter and operated simultaneously with said first clocked inverter in response to the complementary clock signals;

said inverters, connecting means and clock pulse applying means each including no diodes, whereby an input signal and an output signal of each of said first, second and third inverters have a frequency half the frequency of said complementary input clock signals which are applied to the gates of said switching transistors of said clocked inverters.

27. A binary counter according to claim 26 wherein said pair of switching transistors of each clocked inverter are interposed between said pair of inverting transistors.

28. A binary counter according to claim 26 wherein said pair of inverting transistors of each clocked inverter are interposed between said pair of switching transistors.

29. A binary counter according to claim 28 wherein the operating voltage on said first and second power supply terminals has a fixed level.

30. A binary counter according to claim 28 wherein the level of the operating voltage on said first and second power supply terminals varies in the same relationship as that which the clock signals supplied to the gate electrodes of said switching transistors bear with each other.

* * * * *